United States Patent [19]

Quievy et al.

[11] Patent Number: 4,967,160

[45] Date of Patent: Oct. 30, 1990

[54] FREQUENCY MULTIPLIER WITH PROGRAMMABLE ORDER OF MULTIPLICATION

[75] Inventors: Didier Quievy, Massy; Francis Desjouis, Maintenon, both of France

[73] Assignee: Thomson-CSF, Puteaux, France

[21] Appl. No.: 369,859

[22] Filed: Jun. 22, 1989

[30] Foreign Application Priority Data

Jun. 24, 1988 [FR] France .................. 88 08528

[51] Int. Cl.⁵ .......................................... H01B 19/00
[52] U.S. Cl. ...................................................... 328/16
[58] Field of Search .................. 328/15, 16, 17, 21, 328/165, 193, 167; 307/219.1, 290, 351, 520, 440, 465, 529; 377/47

[56] References Cited

U.S. PATENT DOCUMENTS

| | | | |
|---|---|---|---|
| 3,568,069 | 3/1971 | Gabor | 328/14 |
| 3,777,271 | 12/1973 | Telewski | 328/16 |
| 4,137,503 | 1/1979 | Ziesmer | 328/155 |

FOREIGN PATENT DOCUMENTS 0138438  4/1985 European Pat. Off. .

OTHER PUBLICATIONS

IEEE Transactions on Electron Devices, vol. ED-16, No. 2, Feb. 1969, pp. 225-227, G. F. Ross: "Synchronized Microwave Energy Generation by Harmonic Filtering".

Primary Examiner—Stanley D. Miller
Attorney, Agent, or Firm—Oblon, Spivak, McClelland, Maier & Neustadt

[57] ABSTRACT

This frequency multiplier circuit with variable multiplication order is of the type comprising a comb generator that receives, at input, a signal at the base frequency to be multiplied, and gives, at output, a composite pulse signal having a plurality of harmonic lines of the base frequency, said comb generator being followed by a pass-band filter that can be tuned selectively to one of these harmonic lines. The comb generator is formed by logic means having two complemented outputs, a synchronous input, the actuation of which controls the changing of these outputs from one logic state to the other, and a asynchronous input, the actuation of which controls, independently of the state of the synchronous input, the changing of these outputs to the states complementary to those generated by the actuation of the synchronous input. The base frequency signal is biased beforehand so that its excursion takes place around the transition voltage controlling the change from one logic state to the other, said signal being applied to the synchronous input of the logic means, and a first output of these means is connected to asynchronous input and the second output delivers said composite pulse signal to the the pass-band filter.

6 Claims, 2 Drawing Sheets

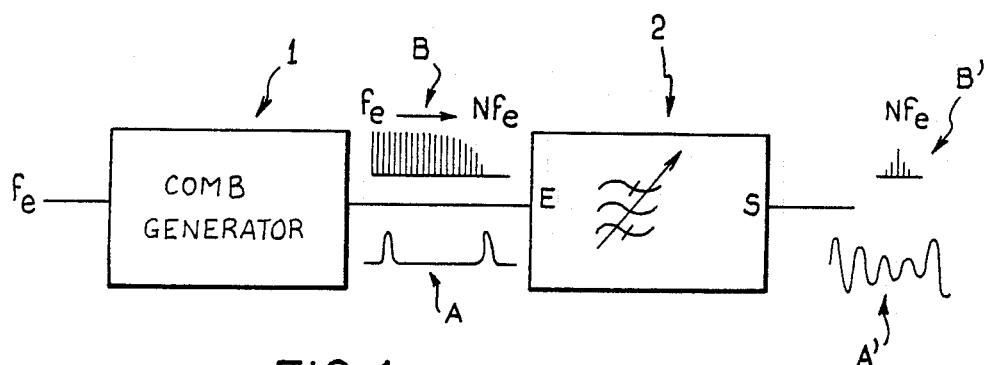
FIG_1 (PRIOR ART)
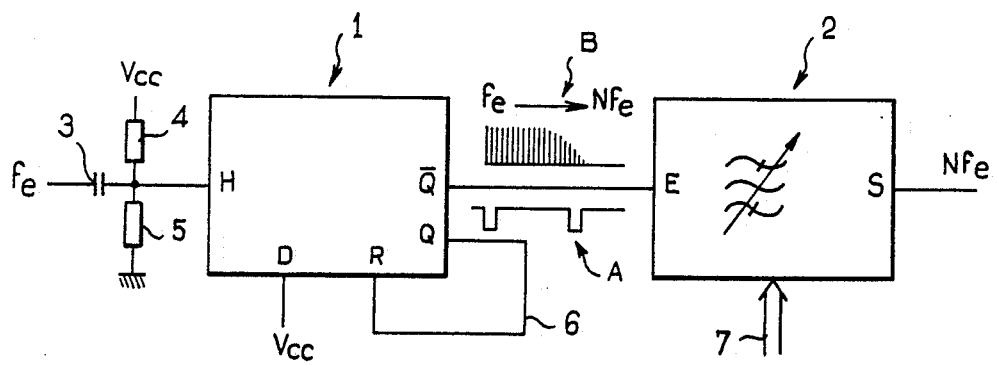
FIG_2
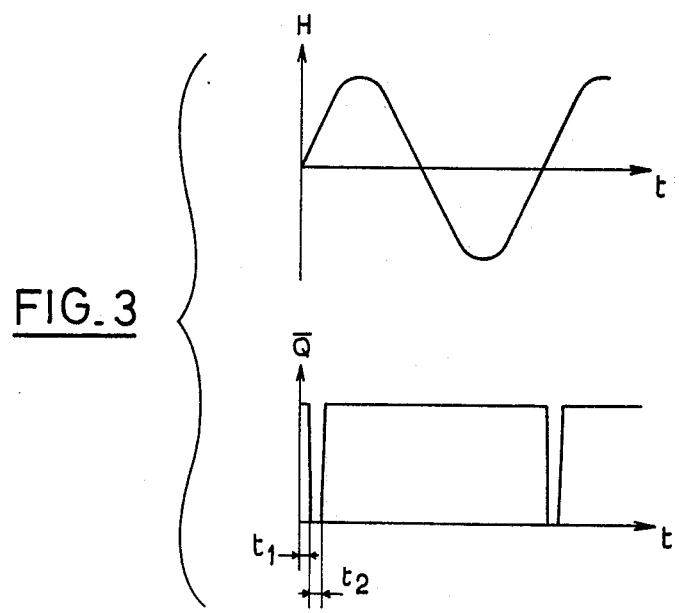
FIG_3

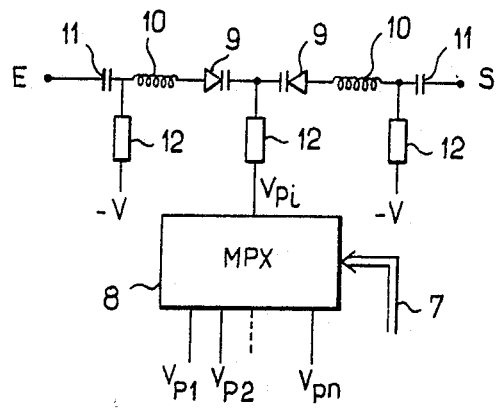
FIG_4
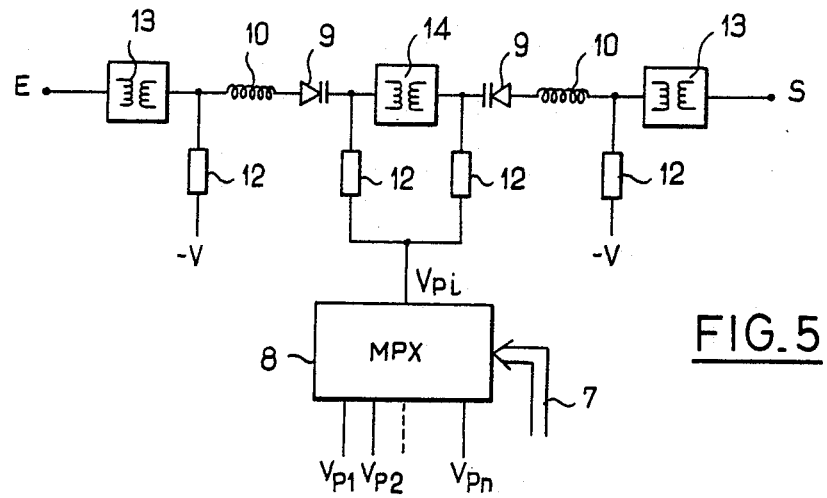
FIG_5
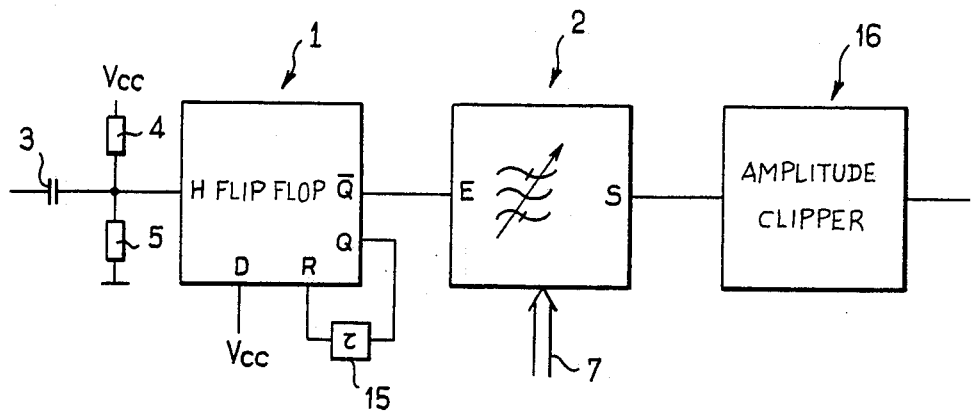
FIG_6

FREQUENCY MULTIPLIER WITH PROGRAMMABLE ORDER OF MULTIPLICATION

BACKGROUND OF THE INVENTION

1. Field of the Invention

The present invention concerns a frequency multiplier circuit with variable order of multiplication.

The invention can be applied in particularly, but not restrictively, to the generation of signals by frequency synthesis. This is a technique commonly used in radars and telecommunications systems.

2. Description of the Prior Art

In effect, frequency multiplication is one of the basic operations in frequency synthesis, and, to this end, it is advantageously possible to use a frequency multiplier with a variable multiplication order, either by mechanical or analog control or by digital control (we then refer to a programmable multiplication order).

There are many known frequency multiplication circuits, based on the production of energy distributed on harmonics of a basic frequency applied to the input of the multiplier.

When variable or programmable and/or high order multiplication (namely with an order of more than 5) is sought, a circuit of the type shown in FIG. 1 is generally used. This circuit essentially has a comb generator 1, associated with a tunable pass-band filter 2.

The signal with the base frequency $f_e$, applied at input to the comb generator, is deformed by the non linear transfer characteristic of this generator into a temporal wave which ha the shape shown in A, the frequential image of this temporal wave shown in B being a comb spectrum having a large number of harmonics of the base frequency $f_e$.

The signal A,B is applied to a tunable pass-band filter 2 which selects only the N order harmonic line (illustrated in B'), i.e. corresponding to the frequency $N.f_e$ and to it alone (leaving out surrounding unwanted lines which result from the fact that the response of the filter never as perfectly sharp edge's). The corresponding temporal wave in shown at A'.

For the comb generator 1, a snap-off type diode has generally been used (this component is well known for its microwave applications) the very sharp reaction of switching over from the forward direction to the reverse direction enabling the generation of high order harmonics with an energy level that is relatively constant over a wide range of harmonic frequencies.

Nonetheless, this assembly has certain drawbacks which are inherent to the properties of snap-off diodes, notably low efficiency, high intrinsic phase noise, and sensitivity to charge and to the environment.

To restrict these drawbacks, it is necessary to provide for high driving power at the input of the comb filter, as well as a separating stage between the comb generator 1 ad the pass-band filter 2 to prevent the impedance characteristics of the latter from disturbing the operation of the comb generator.

SUMMARY OF THE INVENTION

One of the aims of the present invention is to propose a circuit that overcomes these drawbacks and enables the creation of a frequency multiplier which is simple to design and economical to make, and works with high efficiency (while also economizing one driving stage at the input of the comb generator) enabling direct coupling between the comb generator and the selective filter, and being capable of delivering, at output, a multiplied frequency signal that is closely correlated with the input signal at the base frequency, notably with a very low intrinsic phase noise.

Another object of the invention is the making of a circuit of this type that works in a very wide range of frequencies, typically between 100 kHz and 1 GHz, while preserving an amplitude of the harmonic lines that is practically constant throughout the band of frequencies (the "agile band") used.

Another aim of the present invention is to make this frequency multiplier programmable, i.e. to enable the multiplication order to be chosen by a logic type control, for example a digital word applied to the circuit. To this effect, the invention proposes a frequency multiplier of the general type indicated above, namely a frequency multiplier circuit with variable multiplication order comprising a comb generator that receives, at input, a signal at the base frequency to be multiplied, and gives, at output, a composite pulse signal having a plurality of harmonic lines of the base frequency, said comb generator being followed by a pass-band filter that can be tuned selectively to one of these harmonic lines, and comprising logic means having two complemented outputs, one synchronous input, the actuation of which controls the changing of these outputs from one logic state to the other, and one asynchronous input, the actuation of which controls, independently of the state of the synchronous input, the changing of these outputs to the states complementary o those generated by the actuation of the synchronous input; the base frequency signal being biased beforehand so that its excursion takes place around the transition voltage controlling the change from one logic state to the other, said signal being applied to the synchronous logic means, a first output of these means being connected to the asynchronous input and the second output delivering said composite pulse signal to the pass-band filter located downstream.

According to a number of advantageous characteristics of the invention:

- the asynchronous input is connected to said first output of the logic means, with the interposing of a time constant element, so as to prolong the duration of the composite pulse signal delivered to said second output of the logic means to the optimum;
- said logic means are flip-flop circuit means, the synchronous input being formed by the clock input, and the asynchronous input being formed by the zero-setting input, said flip-flop circuit means having notably a D type flip-flop, the D input of which is carried to the high logic level;
- the pass-band filter is a digital control filter so as to make the multiplication order of the circuit programmable; and
- there is provision, at the output of the pass-band filter, for an amplitude clipper which can be used to preserve essentially, from the output signal of the pass-band filter, only the phase modulation of this signal, in reducing its amplitude modulation to a minimum.

BRIEF DESCRIPTION OF THE DRAWINGS

Other features and advantages of the invention will appear from the following detailed description of various embodiments, may be with reference to the appended drawings, of which:

FIG. 1, mentioned above, shows the general structure, known per se of a frequency multiplier circuit working by means of a comb generator;

FIG. 2 is homologous to FIG. 1, for the circuit according to the invention;

FIG. 3 shows the respective timing diagrams at input and output of the comb generator of the circuit of FIG. 2;

FIG. 4 shows an example of a programmble passband filter which can be used in the circuit of FIG. 2;

FIG. shows another example of a programmable pass-band filter which can be used in the circuit of FIG. 2;

FIG. 6 is an alternative embodiment of the circuit of FIG. 2, with a certain number of advantageous modifications.

DETAILED DESCRIPTION OF THE PREFERRED EMBODIMENTS

FIG. 2 shows the general schematic drawing of the circuit of the present invention wherein, as in FIG. 1, a comb generator 1 produces signals applied to a tunable pass-band filter 2.

In a manner which is characteristic of the present invention, the comb generator 1 consists not of an analog component with a non-linear transfer characteristic (typically a snap-off diode) as in the prior art but of a flip-flop logic circuit which, when made to trip suddenly, enables the generation of high-order harmonics.

To this effect, it is notably possible to use, as shown in FIG. 2, a D type flip-flop, the clock input H of which (namely the input controlling the tripping) receives the base frequency $f_e$ signal through a bypass capacitor 3. This signal is biased, by means of a divider bridge with resistors 4 and 5, at a voltage close to the transition voltage of the flip-flop, so that the excursion of the signal takes place around this transition voltage. The waveform of the signal at the base frequency $f_e$ is not of vital importance (except as regards the phase noise which proves to do better for a square-wave signal). This signal could as well be sinusoidal as shown in the timing diagram at the top of FIG. 3, as square, triangular, etc.

The D input of the flip-flop is carried to the high level, so that the tripping is actuated by only one logic command, namely the signal applied to the clock input H.

The complemented output $\overline{Q}$ forms the output of the comb generator, while the non-complemented output Q is looped to the zero-setting input R by a direct link 6.

We shall now describe the working of this comb generator, namely the manner in which, in receiving the signal $f_e$ at is input, the flip-flop will generate, at the output $\overline{Q}$, the narrow pulse depicted in the timing diagram at the bottom of FIG. 3.

We shall describe the working of this comb generator, namely the manner in which, on receiving the signal $f_e$ at its input, the flip-flop will generate the fine pulse, shown in the timing diagram at the bottom of FIG. 3, on the output $\overline{Q}$.

The active transition of the signal at the clock input to the frequency $f_e$ causes the output Q to trip (synchronously) to the same logic state as that present at the D input, namely the high logic state since this input is permanently connected to the direct supply voltage, at the end of a period $t_1$ corresponding to the intrinsic delay time of the flip-flop.

The high level thus obtained at the output Q will actuate (asynchronously) the zero-setting input R thus forcing the output Q to the state complementary to that of the input D, hence to the low state, at the end of a period $t_2$ related to the response time of the circuits used for the flip-flop.

The signal $\overline{Q}$, which is complementary to the signal Q, will therefore have the appearance shown in the timing diagram at the bottom of FIG. 3, a pulse being therefore generated during the above-mentioned period $t_2$.

This pulse is generated at the same frequency $f_e$ as the base signal applied to the input H but, owing to its pulse shape, has a very wide harmonic spectrum with an amplitude of successive lines having an envelope that is substantially in sin x/x, i.e. comparable to that which would be obtained with a comb generator of the snap-off diode type, so much so that it is possible to obtain a relatively constant energy level over a very wide range of harmonic lines.

However, unlike in the snap-off diode assembly, it is noted that the phase noise of the resultant spectrum is very low and that, furthermore, the energy yield of the flip-flop comb generator is very high so that it is not necessary to provide, as in the prior art, for any driving circuit upstream of the comb generator, i.e. a circuit which was its if an additional source of unwanted phase noises.

Furthermore, owing to the fact that the comb generator is a logic circuit, the signal at the output $\overline{Q}$ is totally independent of the load present at this terminal of the logic circuit, so that the circuit $\overline{Q}$ of the flip-flop can be directly connected to the input E of the filter without any separating stage which was needed in the prior art and which, in addition to its cost and the complexity of design that it entailed, was an additional source of deterioration in the quality of the signal delivered by the comb generator.

The period $t_2$ during which the pulse is produced is related to the speed of the logic circuit and, therefore, depends on the technology used. In practice, the comb of harmonic lines associated with these pulses can be used practically up to a maximum frequency $f_{max} = 0.5/t_2$ for a $-3$ dB band.

Thus, with the currently used techniques, it is possible to obtain harmonic lines up to frequencies of 100 to 200 MHz with TTL and CMOS fast logic circuits ($t_2$ of the order of 2.5 to 5 ms), 160 to 330 MHz in ECL logic circuits ($t_2$ of the order of 1.5 ms) and up to 1 GHz with GaAs logic circuits ($t_2$ of the order of 500 ps).

With respect to the lower limit, the rising time of the signal applied to the input H cannot be smaller than a maximum value imposed by the technology used. If it is desired to go below this threshold, it is enough, instead of directly applying the frequency $f_e$ signal to the input of the flip-flop, to place a shaping circuit of the Schmitt trigger type upstream of this flip-flop, so that the base frequency $f_e$ at input will have no lower limit whatsoever.

Other configurations than those with a D type flip-flop can be used for the logic circuit, and it is possible to use most of the logic circuits of the sequential type to achieve the function thus described, notably other types of flip-flops, shift registers, counters, etc.

As a rule, the logic circuit should have:
two complemented outputs Q and $\overline{Q}$, a synchronous input (the clock input H in the embodiment of FIG. 2), the actuation of which controls the changing of these outputs from one logic state to the other (by transmission of the fixed state at the input D to the output Q and of this same reversed state to the output Q in the embodiment of FIG. 2), and, an asynchronous input (the zero-setting input R in the embodiment of FIG. 2), the actuation of which controls, independently of the state of the asynchronous input, the changing of the outputs Q and Q to the states complementary to those generated by the actuation of the synchronous input (by setting at zero in the exemplary embodiment of FIG. 2).

More precisely, the asynchronous input can enable the setting of the logic state of the output Q at either zero or one, and this input can be actuated either by a "0" state (in the example of a TTL or CMOS logic circuit) or by a state "1" (in the example of an ECL logic circuit). It is thus possible to deduce four possible basic diagrams, all of which are functionally equivalent.

With regard to the pass-band filter 2, many standard assemblies can be used, and the type of filter used is not of vital importance for the working of the comb generator, since this comb generator, which is of the logic type, will operate in an invariable manner, irrespectively of the load coupled to its output.

Advantageously, a programmable type of filter is obtained, namely, a filter for which the central frequency (and hence the chosen order of multiplication) is determined by application of a digital control on a control bus 7.

FIG. 4 is describes a filter of this type: this filter, which is a symmetrical single-pole filter, essentially has two series LC type circuits, each consisting of varactor 9, series mounted with an inductor 10, the tuning frequency of the filter being modified by making the bias, applied to the cathode of the varactor, vary. This variable bias may be achieved notably by means of an analog multiplexer 8 which, depending on the control signal 7 applied to it, selects a voltage $V_{Pi}$ among a plurality of voltages $V_{P1}, V_{P2}..., V_{Pn}$, each of these voltages corresponding to a value of the varactor 9 providing for a tuning of the LC resonant circuit, 9, 10, to a frequency centered on one of the lines of the frequency comb applied to the input E.

This filter also has coupling capacitors 11 at input and output, as well as impedances 12 formed by barrier inductors and/or high value resistors enabling the high frequency signals to be separated from the DC voltages applied to the cathodes and to the anodes of the varactors.

A varactor-based filter of this type shows high filtering selectivity (to enable the useful harmonic line of the spectrum, and this line alone, to be isolated) and, at the same time, covering a wide band of frequencies, i.e. it has the possibility of being tuned to a large number of frequences corresponding to a large number of orders of multiplication, typically up to the 20th harmonic.

FIG. 5 shows an improved alternative embodiment of the filter of FIG. 4, where the filter of FIG. 4 is modified by the addition of impedance matching transformers 13, 14, 15, so as to obtain a pseudo-symmetrical type of two-pole filter , i.e. one where the impedances present at the terminals E and S may, if necessary, be chosen to be different (through the addition of the transformers 13, 14, 15).

Filters such as those of FIGS. 4 and 5 can be used, with all the desired selectivity, to obtain satisfactory operation on an agile band of about one octave. For wider agile bands, it is enough to provide for a plurality of filters with contiguous sub-bands, applied selectively by appropriate multiplexing.

With respect to the performance characteristics of this circuit, it has been possible to measure an intrinsic phase noise with improvement of at least 10 dB with respect to the snap-of diode mutipler of the prior art, through the use of CMOS technology circuits which are presently the most efficient ones in this field.

FIG. 6 illustrates an alternative embodiment of the diagram of FIG. 2 wherein two improvements (independent of each other) have been provided.

Firstly, with regard to the comb generator, the output Q is no longer connected directly to the zero-setting input R but through a time constant network 15, for example, a low-pass R-C network, the resistor being mounted between the terminals Q and R of the flip-flop, and the capacitor being mounted between the terminal R and the ground.

The incorporation of this time constant network 15 makes it possible to increase the duration of the pulse (the duration $t_2$ of the timing diagram of FIG. 3) thus enabling the energy yield to be optimized according to the range of output frequencies to be covered.

Secondly, an amplitude clipper 16 can be provided at the output of the filter 2. This clipper 16 will enable a reduction in the relative level of the unwanted lines with respect to the useful line, without thereby modifying the structure of the filter.

This clipper 16 may notably be an amplitude clipper that achieves symmetrical clipping of the amplitude modulated and phase modulated signal delivered at the output of the filter 2. As for this signal, it shows no transfer of amplitude modulation or phase modulation. Thus, at the output of the clipper, there remains only the phase modulation energy. This will make it possible to reduce unwanted lines in the signal obtained at the output of the circuit.

This clipper circuit may be formed notably by a standard type of transistor-based differential stage, which is perfectly suited to implementing the present invention.

This stage is preceded, if necessary, by a linear amplifier.

Typically, it is possible to obtain, for a maximum level of unwanted modulation of −6 dBc at the output of the filter 2, a maximum level of unwanted modulation of −30 dBc at the output on the clipper 16.

What is claimed is:

1. A frequency multiplier circuit with variable multiplication order comprising a comb generator that receives, at input, a signal at the base frequency to be multiplied, and gives , at output, a composite pulse signal having a plurality of harmonic lines of the base frequency, said comb generator being followed by a pass-band filter that can be tuned selectively to one of these harmonic lines, and comprising logic means having two complemented outputs, one synchronous input, the actuation of which controls the changing of these outputs from one logic state to the other, and one asynchronous input, the actuation of which controls, independently of the state of the synchronous input, the changing of these outputs to the states complementary to those generated by the actuation of the synchronous input;

the base frequency signal being biased beforehand so that its excursion makes place around the transition voltage controlling the change from one logic state to the other, said signal being applied to the synchronous logic means, a first output of these means being connected to the asynchronous input and the second output delivering said composite pulse signal to the pass-band filter located downstream.

2. The circuit of claim 1, wherein the asynchronous input is connected to said first output of the logic means with the interposition of a time constant network so as to extend, to the optimum, the duration of the composite pulse signal delivered on said second output of the logic means.

3. The circuit of claim 1, wherein said logic means are flip-flop means, the synchronous input being formed by a clock input(H) and the asynchronous input being formed by a zero-setting input (R).

4. The circuit of either of the claims 1 or 2, wherein the flip-flop means comprise a D type flip-flop, the D input of which is maintained at the high logic level.

5. The circuit of claim 1, wherein the pass-band filter is a filter with digital control, so as to make the order of multiplication of the circuit programmable.

6. The circuit of claim 1, wherein there is provided, at the output of the pass-band filter, an amplitude clipper making it possible to preserve, essentially, from the output signal of the pass-band filter, only the phase modulation of this signal in reducing its amplitude modulation to the minimum.

* * * * *